United States Patent
Kwon et al.

(10) Patent No.: US 7,588,964 B2
(45) Date of Patent: Sep. 15, 2009

(54) METHODS OF STACKING SEMICONDUCTOR DEVICES AND METHODS OF FABRICATING SEMICONDUCTOR DEVICE PACKAGES USING THE SAME

(75) Inventors: Yong-Chai Kwon, Suwon-si (KR);
Dong-Ho Lee, Seongnam-si (KR);
Myung-Kee Chung, Cheonan-si (KR);
Kang-Wook Lee, Suwon-si (KR);
Sun-Won Kang, Seoul (KR);
Keum-Hee Ma, Andong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 11/790,173

(22) Filed: Apr. 24, 2007

(65) Prior Publication Data
US 2008/0169545 A1    Jul. 17, 2008

(30) Foreign Application Priority Data
Jan. 16, 2007    (KR)    ............ 10-2007-0004898

(51) Int. Cl.
*H01L 23/02* (2006.01)
(52) U.S. Cl. ............ 438/109; 257/686; 257/E21.499; 257/E23.18
(58) Field of Classification Search ........ 257/686, 257/E21.499, E23.18; 438/109
See application file for complete search history.

(56) References Cited

U.S. PATENT DOCUMENTS 6,916,725 B2    7/2005    Yamaguchi

2004/0080045 A1*    4/2004    Kimura et al. ............ 257/736
2004/0207082 A1*    10/2004    Yamano et al. ............ 257/738
2005/0224946 A1*    10/2005    Dutta ............ 257/686
2005/0280160 A1*    12/2005    Kim et al. ............ 257/777
2007/0096287 A1*    5/2007    Araki et al. ............ 257/686

FOREIGN PATENT DOCUMENTS

| KR | 10-2002-0012061 | 2/2002 |
| KR | 10-2005-0073682 | 7/2005 |
| KR | 10-2005-0120280 | 12/2005 |
| KR | 10-2005-0122532 | 12/2005 |

* cited by examiner

*Primary Examiner*—Matthew Smith
*Assistant Examiner*—Walter H Swanson
(74) *Attorney, Agent, or Firm*—Harness, Dickey & Pierce, P.L.C.

(57) ABSTRACT

A stacked structure of semiconductor devices may include a plurality of stacked semiconductor devices, each having an upper surface and a lower surface and one or more via electrodes protruding from the upper surface to the lower surface. The via-electrodes may have upper parts (heads) protruding from the upper surface and lower parts (ends) protruding from the lower surface. The stacked semiconductor devices may be electrically connected to each other through the via-electrodes. A first adhesive film (e.g., patternable material) and a second adhesive film (e.g. puncturable material) may be formed between the stacked semiconductor devices. The stacked structure of semiconductor devices may be mounted on the upper surface of a printed circuit board (PCB) having a mount-specific adhesive film to form a semiconductor device package. The mounted stacked structure and the upper surface of the PCB may be further covered with a molding material.

13 Claims, 11 Drawing Sheets

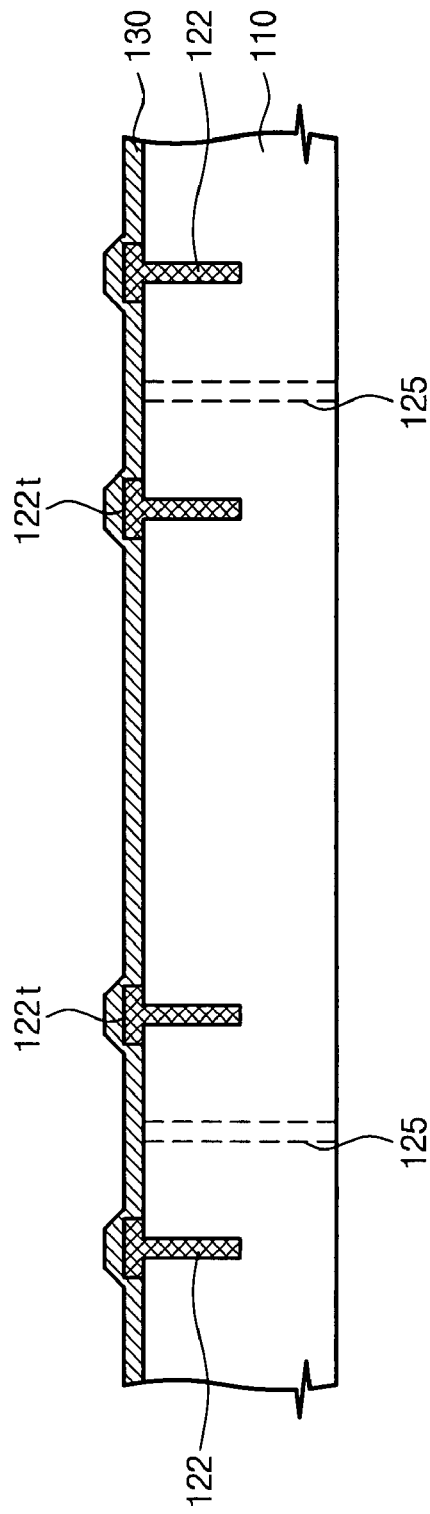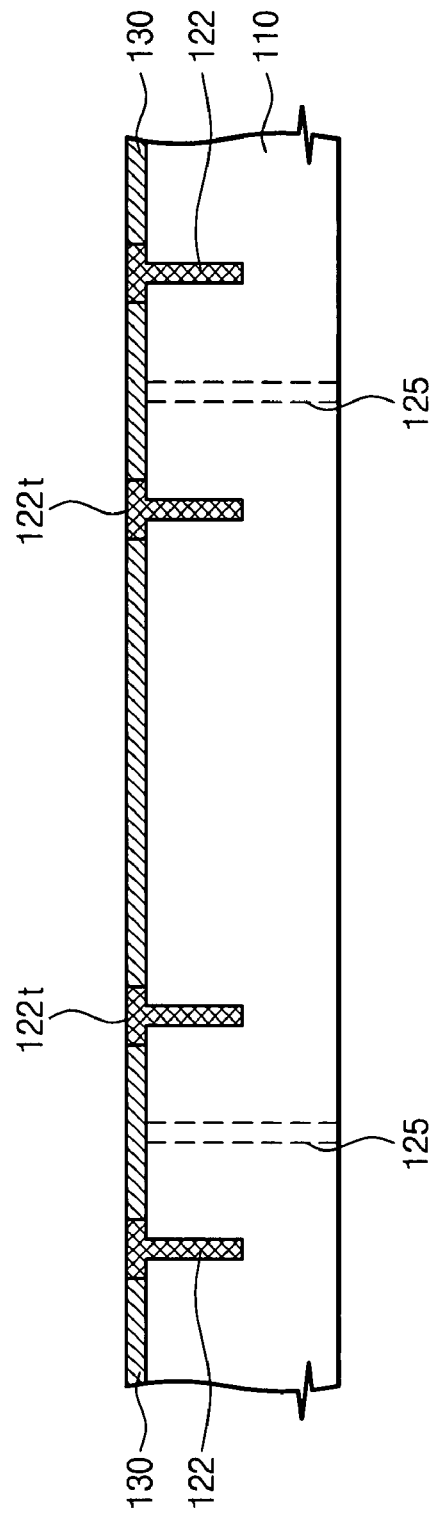

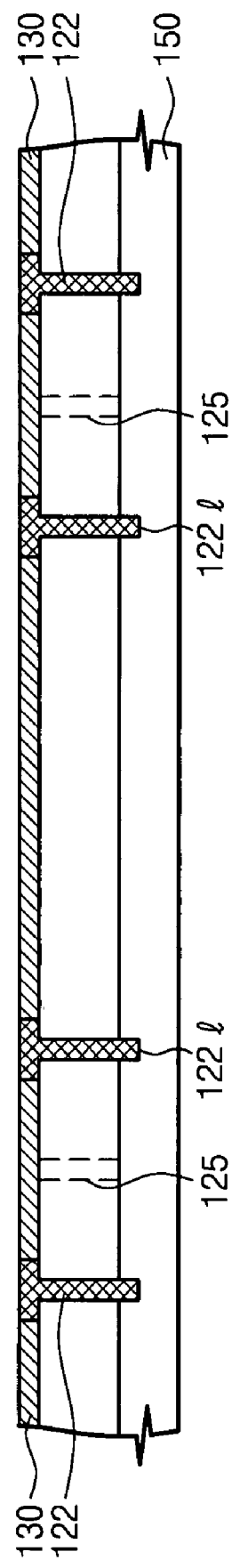

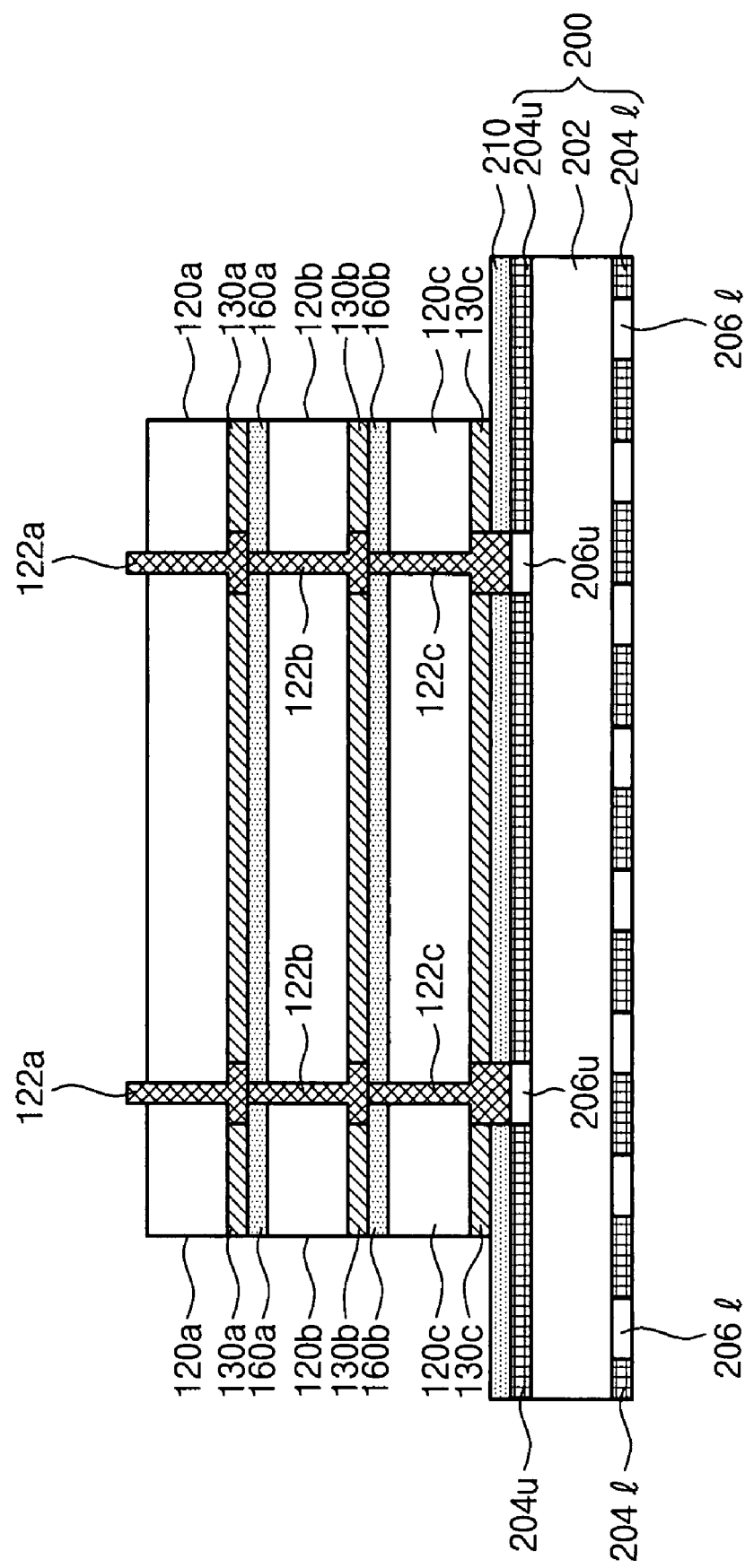

METHODS OF STACKING SEMICONDUCTOR DEVICES AND METHODS OF FABRICATING SEMICONDUCTOR DEVICE PACKAGES USING THE SAME

PRIORITY STATEMENT

This U.S. non-provisional patent application claims priority under 35 U.S.C. §119(a) to Korean Patent Application No. 10-2007-0004898, filed on Jan. 16, 2007 in the Korean Intellectual Property Office (KIPO), the entire contents of which are incorporated herein by reference.

BACKGROUND

1. Technical Field

Example embodiments relate to a stacked structure of semiconductor devices, a semiconductor device package, and methods of fabricating the same.

2. Description of Related Art

Packaging technologies for integrated circuits (ICs) have been steadily improving to keep up with demands for miniaturization and/or mounting reliability. The demand for miniaturization has accelerated technical developments in the semiconductor chip packaging area, achieving a degree of miniaturization even as small as the actual size of a typical semiconductor chip. Mounting reliability may also be important to packaging, providing mounting efficiency and mechanical/electrical reliability after mounting the semiconductor chips.

Driven by continuing demands for increased performance along with miniaturization of electronics, there have been a variety of efforts to provide higher-capacity semiconductor products. The conventional method of making higher-capacity (enlarged storage capacity) semiconductor products may involve higher-density integration of the semiconductor memory chips. Higher-density integration of memory chips may be accomplished by placing as many memory cells as possible into a given area. However, such two-dimensional integration of the memory cells may require the use of more advanced technology, including microscopic line widths, and/or longer development terms. Accordingly, stacking has been proposed as a solution for fabricating improved higher-capacity semiconductor products.

The term "stacking" is understood in the semiconductor industry to mean a method of vertically stacking two or more semiconductor chips on top of one another. For example, two 64-Mb flash memory chips may be stacked to form a 128 Mb flash memory, or two 128-Mb flash memory chips may be stacked to form a 256 Mb flash memory. Because stacking semiconductor device packages may increase mounting density and the use of space, those in the industry have been actively working to develop improved stack structures as well as processes for fabricating semiconductor device packages.

FIGS. 1A, 1B, 2A, and 2B are sectional views illustrating a conventional procedure for stacking semiconductor devices. Referring to FIGS. 1A and 1B, semiconductor devices 20a and 20b may include via-electrodes 22a and 22b, respectively. The semiconductor devices 20a and 20b may have upper surfaces with bonding pads (not shown) and lower surfaces opposite to the upper surfaces. Via-electrodes 22a and 22b may be connected to the bonding pads (not shown) and may have upper parts (heads) protruding from the upper surfaces and lower parts (ends) protruding from the lower surfaces.

Semiconductor device 20a may be used as a base for a semiconductor device stack, and an adhesive film 30a may be formed on the upper surface of the semiconductor device 20a. The adhesive film 30a may include a patternable material that may be selectively etched (e.g., photolithography process) to expose at least a part of the head of via-electrode 22a. Semiconductor device 20b may be stacked on semiconductor device 20a by connecting the end of via-electrode 22b with the exposed head of the via-electrode 22a.

Because the adhesive film 30a may be formed in a spin-on mode, the adhesive film 30a may have a higher density of solvent and photoactive compound (PAC) and a lower density of reactant for bonding. As a result, adhesion between the adhesive film 30a and the lower surface of the semiconductor device 20b may not be sufficient, thereby decreasing the reliability of the stacked structure.

Referring to FIGS. 2A and 2B, semiconductor devices 20a and 20b may include via-electrodes 22a and 22b, respectively. The semiconductor devices 20a and 20b may have upper surfaces with bonding pads (not shown) and lower surfaces opposite to the upper surfaces. Via-electrodes 22a and 22b may be connected to the bonding pads (not shown) and may have heads protruding from the upper surfaces and ends protruding from the lower surfaces. An adhesive film 60a may be formed to cover the upper surface of the semiconductor device 20a. The adhesive film 60a may include a material capable of being punctured, meaning that the material may be pierced without fragmenting into parts. To stack semiconductor device 20b on semiconductor device 20a, the end of via-electrode 22b may be used to puncture the adhesive film 60a so as to contact the head of via-electrode 22a, thus forming a stacked structure.

The adhesive film 60a may have improved adhesive properties because of its increased bonding density but may be difficult to pattern. Because it may be difficult to expose via electrode 22a by etching, via electrodes 22a and 22b may be electrically connected by puncturing the adhesive film 60a. However, despite its improved adhesive properties, unetched adhesive film 60a may result in an uneven mounting surface as illustrated in FIG. 2B, thus decreasing the contact areas for adhesion and resulting in decreased reliability of the stacked structure.

SUMMARY OF EXAMPLE EMBODIMENTS

Example embodiments may relate to a semiconductor device package including a stacked structure of semiconductor devices, and methods of fabricating the same. Example embodiments may also relate to a semiconductor device package including a stacked structure of semiconductor devices, and methods for fabricating the same, using an adhesive structure including adhesives with different patterning and puncturing properties. An adhesive structure may include a first adhesive film having first patterning properties and first puncturing properties; and a second adhesive film on the first adhesive film, the second adhesive film having second patterning properties and second puncturing properties, wherein the first patterning properties are better than the second patterning properties, and the second puncturing properties are better than the first puncturing properties.

A method of stacking semiconductor devices may include preparing a plurality of semiconductor devices, each having an upper surface on which bonding pads may be disposed and a lower surface opposite to the upper surface. One or more via-electrodes may be connected to the bonding pads and may have upper parts (heads) and lower parts (ends) protruding from the upper and lower surfaces, respectively. A first adhesive film may be formed on the upper surface of the semiconductor devices and may be substantially level with the protruding upper parts (heads) of the via-electrodes. Forming the first adhesive film may include forming an adhesive film to cover the upper surface of the semiconductor device, forming a mask pattern to identify the locations of the via-electrodes covered by the adhesive film, and performing an etch process (using the mask pattern as an etch mask) to remove portions of the adhesive film covering the heads of the via-electrodes. A second adhesive film may be formed on the first adhesive film of at least one semiconductor device. The semiconductor devices may be stacked so as to electrically connect the via-electrodes by puncturing the second adhesive film with the protruding lower parts (ends) of the via-electrodes. Stacking the semiconductor devices may be performed by thermal compression.

A method of fabricating a semiconductor device package may include preparing the stacked semiconductor devices described above, preparing a printed circuit board having an upper surface with bonding electrodes and a lower surface opposite to the upper surface, forming a mount-specific adhesive film on the upper surface of the printed circuit board, and mounting the stacked semiconductor devices on the upper surface of the printed circuit board. Mounting the stacked semiconductor devices may be performed by thermal compression. The method of fabricating a semiconductor device package may further include forming a molding material to cover the upper surface of the printed circuit board.

The mount-specific adhesive film may include one of a patternable material and a suitable material for puncturing. If the mount-specific adhesive film is a patternable material, the method of mounting may further include etching the mount-specific adhesive film to expose the bonding electrodes on the upper surface of the printed circuit board and electrically connecting the via-electrodes of the stacked semiconductor devices with the exposed bonding electrodes. If the mount-specific adhesive film is a suitable material for puncturing, the method of mounting may include puncturing the mount-specific adhesive film with the via electrodes so as to electrically contact the bonding electrodes.

A stacked structure of semiconductor devices may include a plurality of stacked semiconductor devices, each having an upper surface with bonding pads and a lower surface opposite to the upper surface. One or more via-electrodes may be connected to the bonding pads and may have upper parts (heads) protruding from the upper surface and lower parts (ends) protruding from the lower surface. A first adhesive film may be on the upper surface of the semiconductor devices and may be substantially level with the protruding heads of the via-electrodes. The first adhesive film may include a patternable material having first patterning properties and first puncturing properties. The first adhesive film may include at least one of a novolak, benzocyclobutene (BCB), polyimide, and epoxy. A second adhesive film may be on the first adhesive film of at least one semiconductor device. The second adhesive film may include a suitable material for puncturing, having second patterning properties and second puncturing properties. The second adhesive film may be in the form of a tape, including at least one of a die attachment film, a non-conductive film, and an anisotropic conductive film. The first patterning properties of the first adhesive film may be better than the second patterning properties of the second adhesive film, while the second puncturing properties of the second adhesive film may be better than the first puncturing properties of the first adhesive film. The stacked semiconductor devices may be electrically connected to each other through the via-electrodes.

A semiconductor device package may include the stacked semiconductor devices described above, a printed circuit board having an upper surface with bonding electrodes and a lower surface opposite to the upper surface, and a mount-specific adhesive film between the stacked semiconductor devices and the upper surface of the printed circuit board. The mount-specific adhesive film may include one of a patternable material and a suitable material for puncturing. The patternable material may include at least one of a novolak, benzocyclobutene (BCB), polyimide, and epoxy. A suitable material for puncturing may be in the form of a tape, including at least one of a die attachment film, a nonconductive film, and an anisotropic conductive film. The semiconductor device package may further include a molding material covering the upper surface of the printed circuit board. The molding material may be an epoxy molding compound.

BRIEF DESCRIPTION OF THE DRAWINGS

The accompanying drawings have been provided merely for purposes of illustration and should not be viewed as limiting the specification. Those ordinarily skilled in the art will appreciate the full scope of the specification when viewing example embodiments described herein together with the teachings as a whole.

FIGS. 4A through 4G are sectional views illustrating a method of stacking semiconductor devices according to example embodiments.

FIGS. 5A through 5D are sectional views illustrating a method of fabricating a semiconductor device package according to example embodiments.

DETAILED DESCRIPTION OF EXAMPLE EMBODIMENTS

Figure 1A:
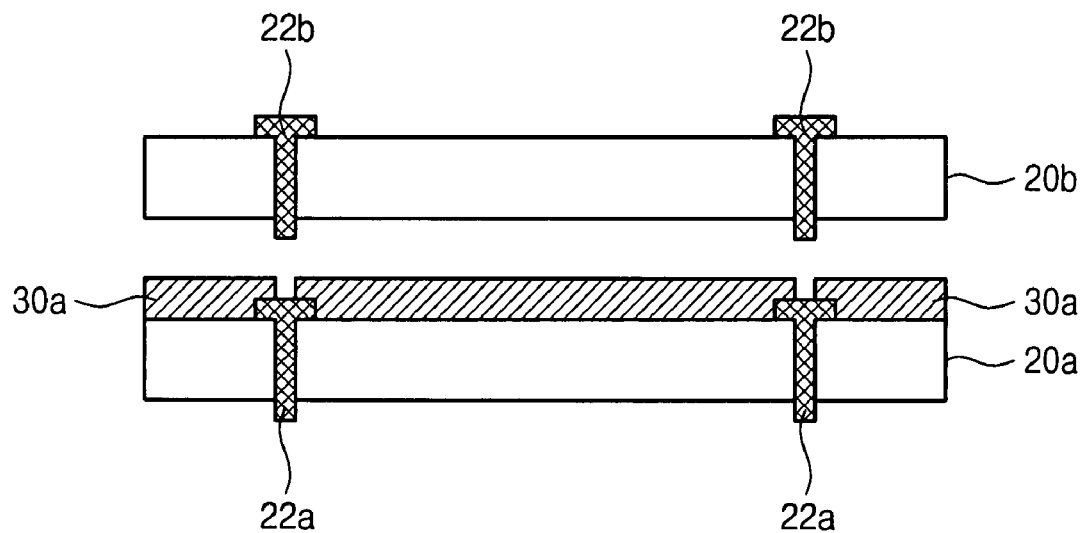
FIGS. 1A, 1B, 2A, and 2B are sectional views illustrating a conventional method of stacking semiconductor devices.
Figure 1B:
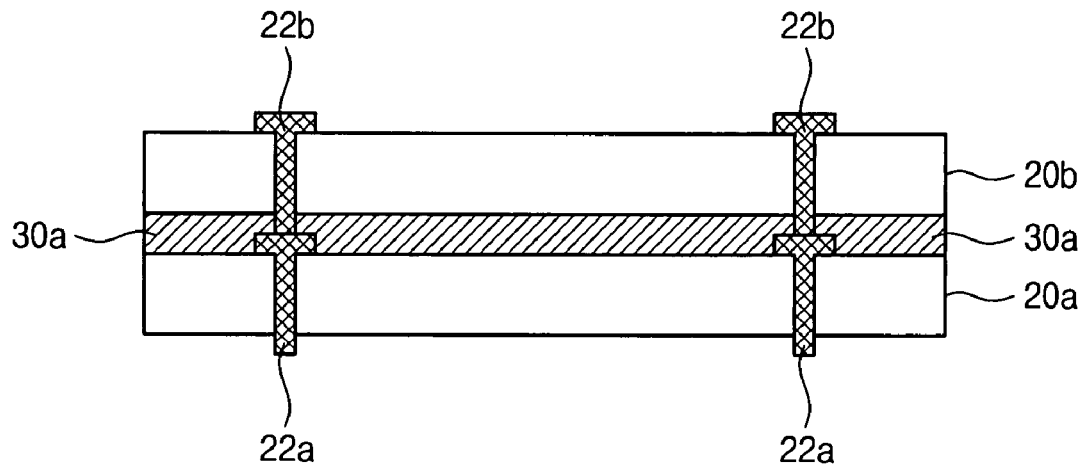
Figure 2A:
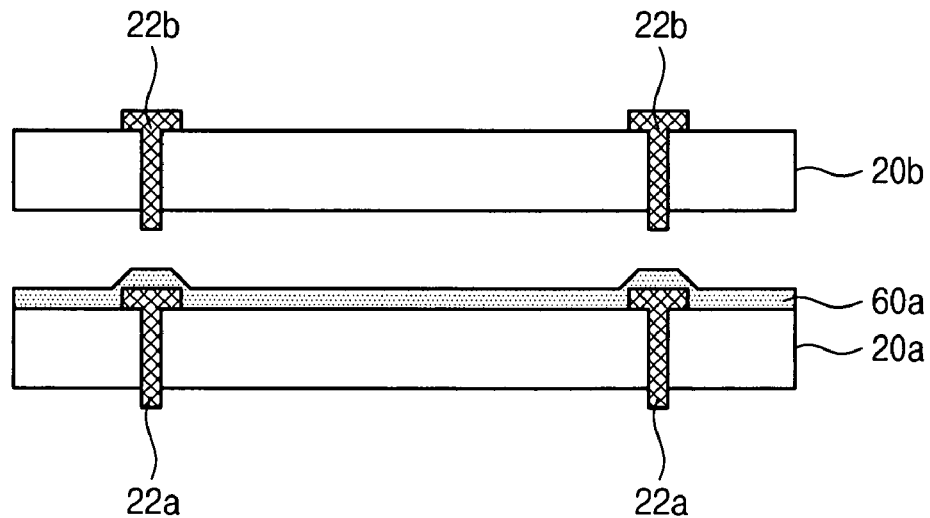
Figure 2B:
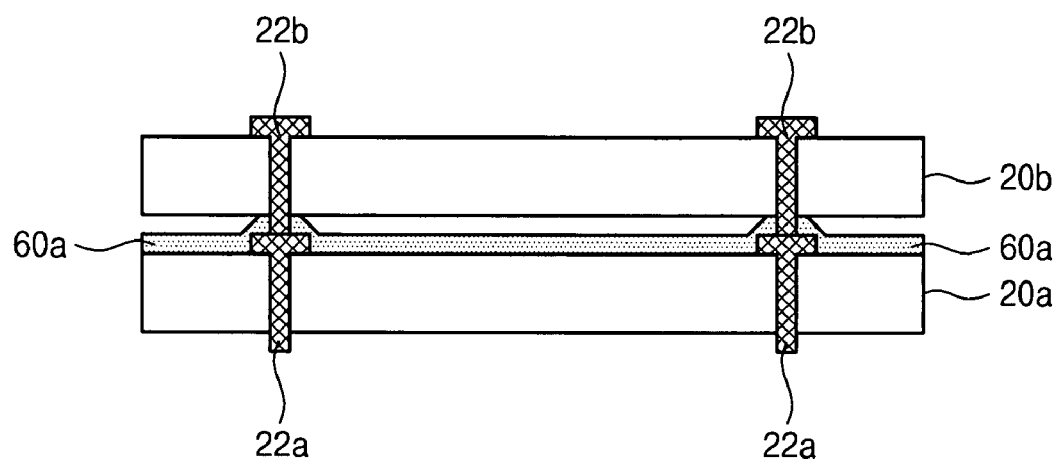

Example embodiments will be described below in more detail with reference to the accompanying drawings. However, example embodiments may be embodied in different forms and should not be constructed as limited to examples set forth herein. Rather, these examples have been provided so that this specification will be fully convey the scope of the teachings to those ordinarily skilled in the art.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 3:
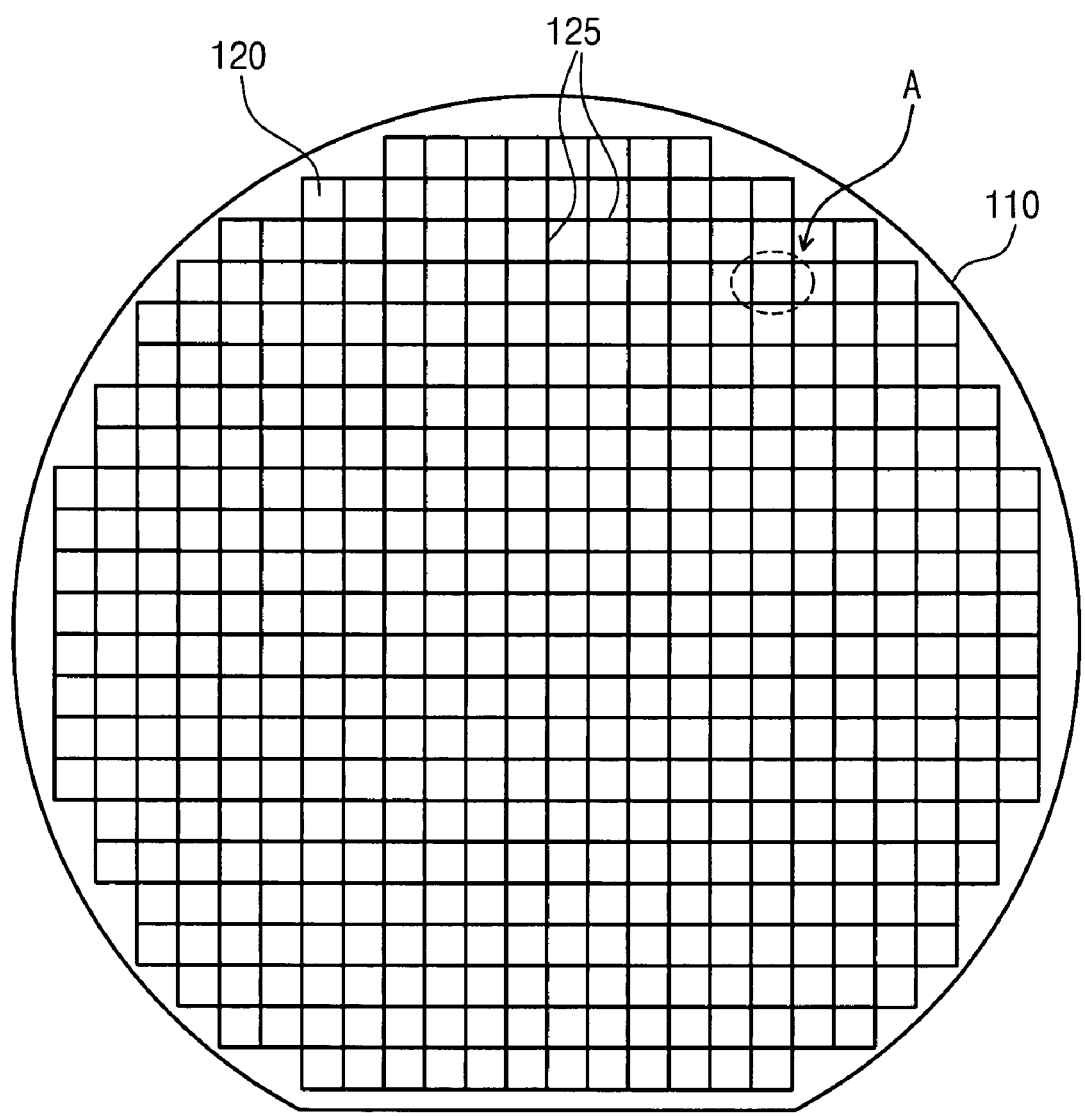
FIG. 3 is a plane view of a semiconductor substrate on which semiconductor chips may be formed according to example embodiments.

FIG. 3 is a plane view of a semiconductor substrate on which semiconductor chips may be formed according to example embodiments. Referring to FIG. 3, a semiconductor substrate (or semiconductor wafer) 110 may be provided. The semiconductor substrate 110 may be a silicon (Si) substrate (or wafer). Semiconductor chips 120 may be provided on the semiconductor substrate 110. The semiconductor substrate 110 may include scribe-lines 125 for dividing the semiconductor chips 120.

Figure 4C:
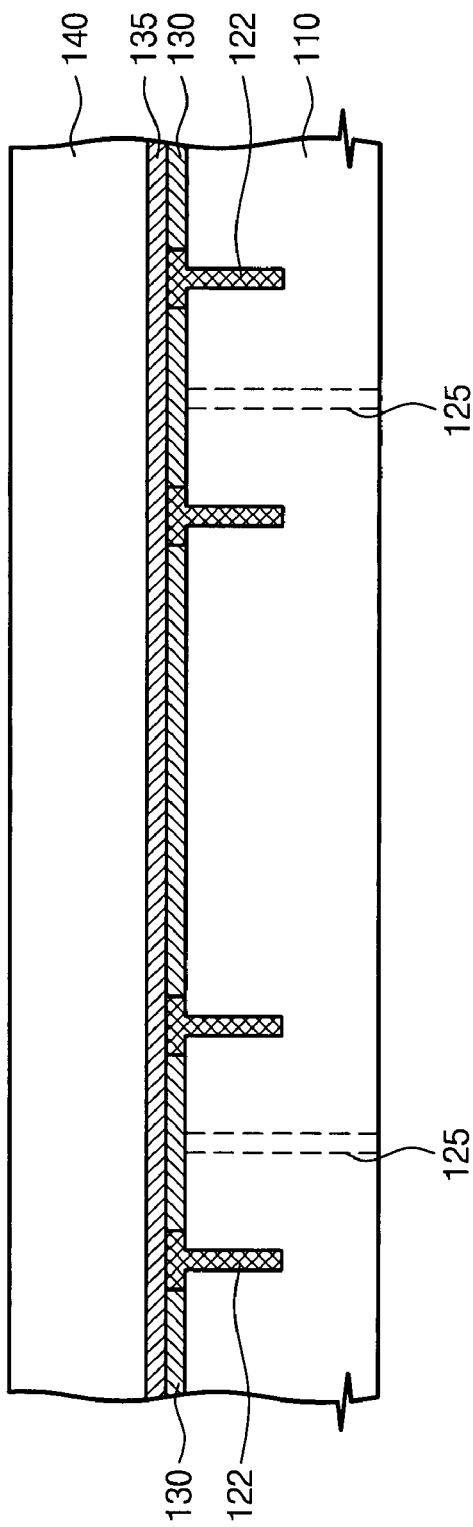

FIGS. 4A through 4G are sectional views illustrating a method of stacking semiconductor devices according to example embodiments. FIGS. 4A through 4E are sections taken from part A (FIG. 3). Referring to FIGS. 4A through 4B, via-electrodes 122 may be connected to bonding pads (not shown) of the semiconductor chips 120 (FIG. 3). The bonding pads (not shown) may be disposed along edges of the semiconductor chips 120. For example, the bonding pads may be arranged in a pattern similar to that disclosed in U.S. Pat. No. 6,916,725, the contents of which are incorporated by reference in their entirety. The via-electrodes 122 may be formed along the edges of the semiconductor chips 120 adjacent to the scribe-lines 125 (FIG. 3). The via-electrodes 122 may be formed by creating trenches at the edges of the semiconductor chips 120 adjacent to the bonding pads and filling the trenches with a conductive material. This conductive material may include copper (Cu), aluminum (Al), copper-aluminum alloy, or other suitable conductive materials or alloys.

The via-electrodes 122 may penetrate the bonding pads (not shown) of the semiconductor chips 120 and the semiconductor substrate 110. The via-electrodes 122 may also penetrate the semiconductor substrate 110 adjacent to the bonding pads of the semiconductor chips. The via-electrodes 122 may be shaped like the capital letter "T," having upper parts 122t protruding from the upper surface of the semiconductor substrate 110 and contacting the bonding pads. A first adhesive film 130 may be deposited on the semiconductor substrate 110, covering the via-electrodes 122. The first adhesive film 130 may include an adhesive material capable of being patterned. The first adhesive film 130 may include at least one of a novolak, benzocyclobutene (BCB), polyimide, and epoxy.

Forming the first adhesive film 130 may include forming an adhesive film 130 on the semiconductor substrate 110, forming a mask pattern (not shown) on the adhesive film 130 to selectively expose portions of the adhesive film 130 covering the upper parts 122t of the via-electrodes 122, and performing an etch process (using the mask pattern as an etch mask) to remove at least a portion of the adhesive film 130 covering the upper parts 122t of the via-electrodes 122. As illustrated in FIG. 4B, the etch process may enable the upper parts 122t of the via-electrodes 122 to be exposed while being substantially level with the first adhesive film 130, thus resulting in a substantially planar surface.

Referring to FIG. 4C, a handling wafer 140 may be adhered to the upper surface of the semiconductor substrate 110 by a substrate-specific adhesive film 135. The handling wafer 140 may be used to reduce mechanical stress to the semiconductor substrate 110 when polishing the lower surface of the semiconductor substrate 110. The handling wafer 140 may reduce, minimize, or prevent the bending of the semiconductor substrate 110, which may decrease in thickness after polishing. The handling wafer 140 may be a substrate equal or similar to the semiconductor substrate 110 in coefficient of thermal expansion (e.g., a silicon substrate and/or a glass substrate). The handling wafer 140 may also be similar in shape to the semiconductor substrate 110 (e.g., round).

To facilitate removal of the handling wafer 140 after polishing the lower surface of the semiconductor substrate 110, the substrate-specific adhesive film 135 may be a reworkable adhesive that may be removed with relative ease. The substrate-specific adhesive film 135 may be used with an adhesive including an ultraviolet (UV) curable resin and/or a thermoplastic resin.

Figure 4D:
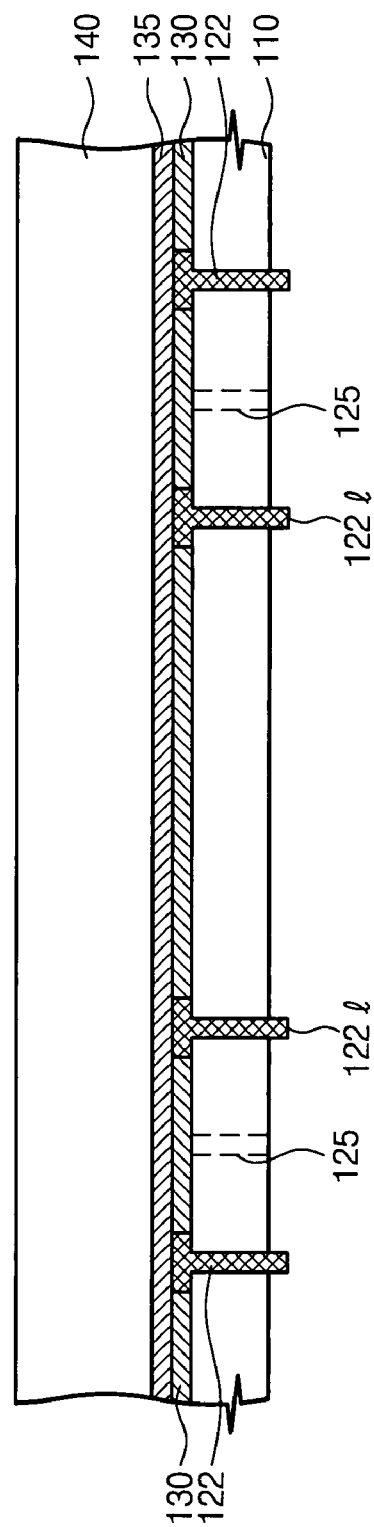

Referring to FIG. 4D, the lower parts 122l (ends) of the via-electrodes 122 may protrude from the lower surface of the semiconductor substrate 110. The lower surface of the semiconductor substrate 110 in FIG. 4C may be polished (e.g., ground) until the lower surface is within relatively close proximity to the lower parts 122l. The lower surface may be further selectively etched until the lower parts 122l of the via-electrodes 122 protrude from the lower surface of the semiconductor substrate 110.

Referring to FIG. 4E, after removing the handling wafer 140 and the substrate-specific adhesive film 135, a cutout-specific adhesive film 150 may be formed on the lower surface of the semiconductor substrate 110. By cutting (e.g., substrate cutting machine) the semiconductor substrate 110 along the scribe-lines 125 (FIG. 3), the semiconductor substrate 110 may be separated into semiconductor chips (e.g., 120a and 120b of FIG. 4F). To facilitate removal of the cutout-specific adhesive film 150 after cutting the semiconductor substrate 110, the cutout-specific adhesive film 150 may be a reworkable adhesive that may be removed with relative ease. The cutout-specific adhesive film 150 may be used with an adhesive including an UV curable resin and/or a thermoplastic resin.

Figure 4F:
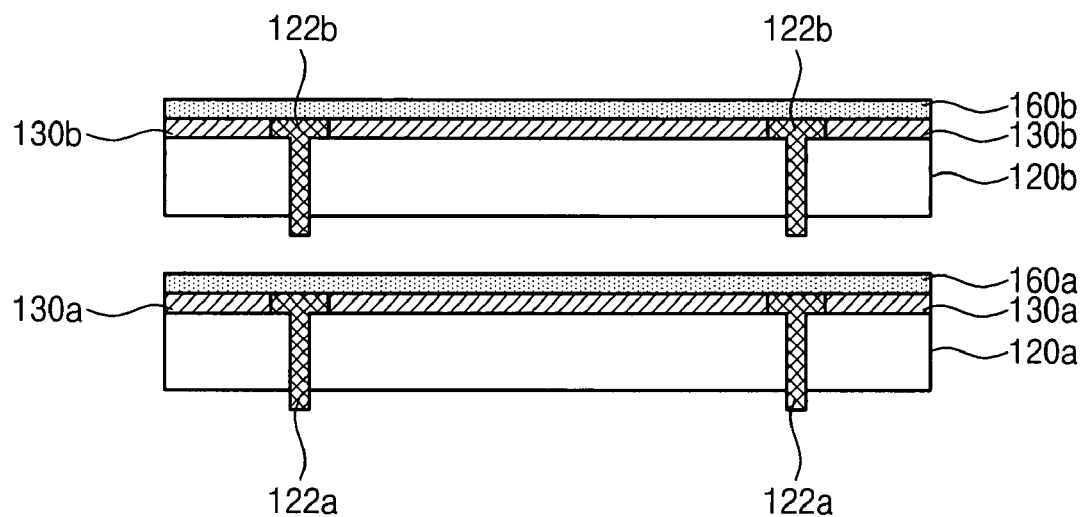
Figure 4G:
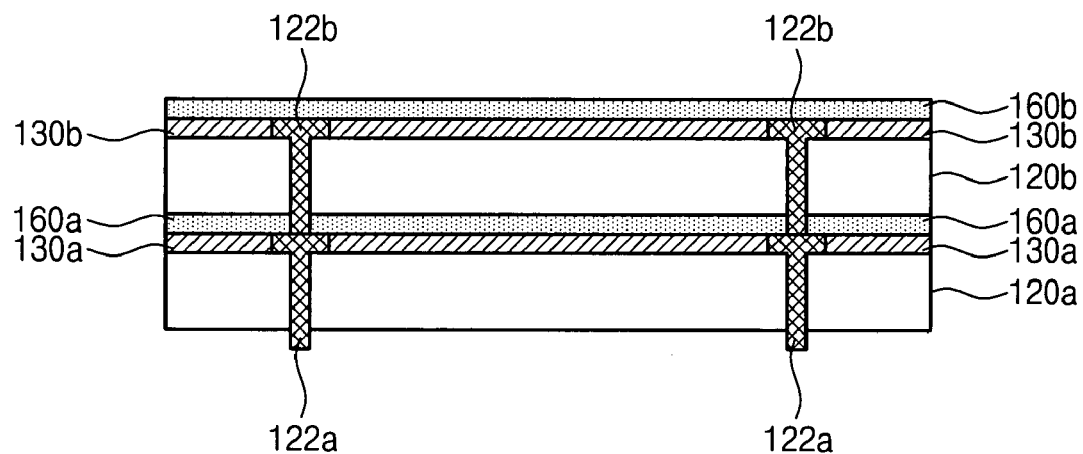

Referring to FIGS. 4F and 4G, after removing the cutout-specific adhesive film 150, second adhesive films 160a and 160b may be formed on the semiconductor chips 120a and 120b, respectively. The second adhesive films 160a and 160b may include an adhesive material capable of being punctured, meaning that the material may be pierced without fragmenting into parts. Additionally, the material may be sufficiently durable so as to substantially maintain its form after being punctured and able to mate with the via-electrode puncturing it. Furthermore, the material may possess at least some degree of elasticity so as to grip the via electrode puncturing it as well as at least some degree of solidity for maintaining an effective grip on the via electrode. The second adhesive films 160a and 160b may be in the form of a tape and may include at least one of a die attachment film (DAF), a nonconductive film (NCF), and an anisotropic conductive film (ACF).

The first adhesive films (e.g., 130a and 130b) may differ from the second adhesive films (e.g., 160a and 160b) in the following physical characteristics: a glass transition temperature (Tg) at which polymer chains change composition, a modulus of elasticity coefficient representing a ratio between stress and deformation, a thermal expansion value as a ratio to temperature of thermal expansion under constant pressure, and/or a Poisson's ratio (a ratio of transverse strain to axial strain when uniaxial stress is applied) obtained from dividing a distortion amplitude vertical to an axis by a distortion amplitude along the axis while extending or contracting an elastic body. Additionally, the first adhesive films (e.g., 130a and 130b) may have first patterning properties and first puncturing properties, while the second adhesive films (e.g., 160a and 160b) may have second patterning properties and second puncturing properties, wherein the first patterning properties are better than the second patterning properties, and the second puncturing properties are better than the first puncturing properties.

Referring to FIGS. 4F and 4G, by connecting the lower parts (ends) 122l (e.g., FIG. 4D) of the via-electrodes 122b, which protrude from the lower surface of the semiconductor device 120b, with the upper parts (heads) 122t (e.g., FIG. 4A) of the via-electrodes 122a, the semiconductor devices 120a and 120b may be stacked together. The via-electrodes 122a and 122b may be connected by puncturing the second adhesive film 160a on the semiconductor device 120a with the lower parts 122l of the via-electrodes 122b. Mounting semiconductor device 120b on semiconductor device 120a may be performed with a thermal compression process.

The first adhesive films 130a and 130b and the second adhesive films 160a and 160b may be made of an adhesive material capable of being patterned and punctured, respectively. Because the first adhesive maternal films 130a and 130b may be formed by a spin-on mode, they may have a higher density of solvent and photoactive compound (PAC) and a lower density of reactant for bonding. The lower bonding density (a quantity of reactant per unit area for bonding) may result in decreased adhesion. The second adhesive films 160a and 160b may have increased adhesion due to a higher bonding density, but may be difficult to pattern.

By utilizing the physical properties of the first adhesive films 130a and 130b and second adhesive films 160a and 160b, the semiconductor devices 120a and 120b may be stacked to form a stacked structure with enhanced reliability. For example, because the first adhesive films 130a and 130b may be patterned, they may be helpful, despite their relatively weak adhesion, in planarizing the upper surfaces of the semiconductor devices 120a and 120b. Additionally, even though the second adhesive films 160a and 160b may have relatively strong adhesion but may be difficult to pattern, they may be helpful in strengthening the physical connection between the semiconductor devices 120a and 120b. However, it is important to note that the second adhesive films 160a and 160b need not have increased adhesive properties with respect to the first adhesive maternal films 130a and 130b.

Therefore, the semiconductor devices 120a and 120b provided with the multi-layer adhesive film structure, including the patternable first adhesive films 130a and 130b and the puncturable second adhesive films 160a and 160b, may have improved adhesion compared to conventional structures. As a result, enhanced reliability of the stacked structure may be achieved.

Figure 5A:
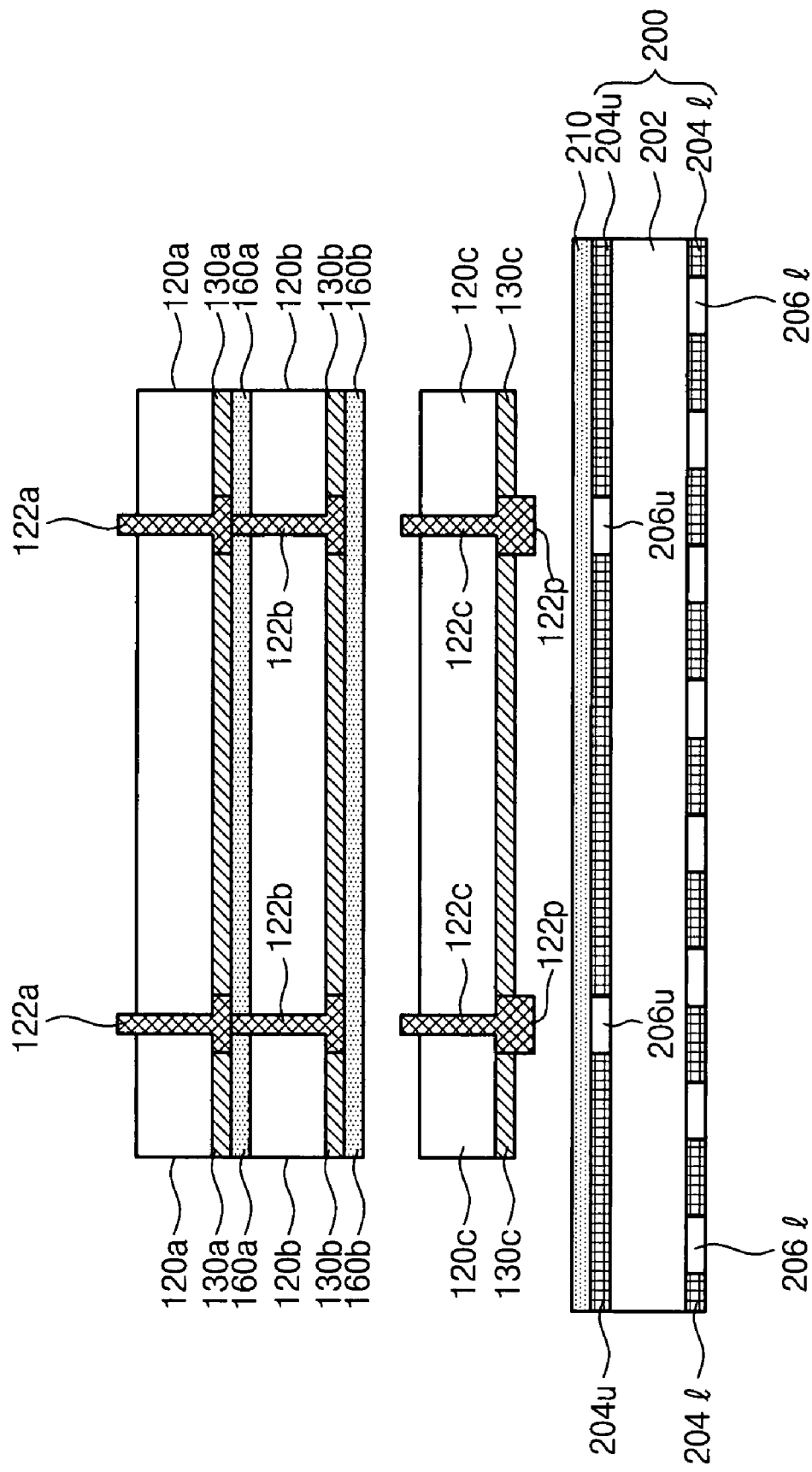

FIGS. 5A through 5D are sectional views illustrating a method of fabricating a semiconductor device package according to example embodiments. Referring FIG. 5A, the stacked semiconductor devices 120a, 120b and/or 120c and printed circuit board (PCB) 200 may be provided. The PCB 200 may include a core material 202, an upper insulation pattern 204u having upper bonding electrodes 206u, and a lower insulation pattern 204l having lower bonding electrodes 206l. The upper and lower insulation patterns 204u and 204l, respectively, may be made of a photo solder resist (PSR). The upper bonding electrodes 206u may be positioned to correspond with via-electrodes 122c of semiconductor device 120c. As illustrated in FIG. 5A, semiconductor device 120c may serve as an end semiconductor device of the stack.

A mount-specific adhesive film 210 may be provided on the PCB 200. The mount-specific adhesive film 210 may include a patternable material or a suitable material for puncturing. The patternable material may include at least one of novolak, benzocyclobutene (BCB), polyimide, and epoxy. The mount-specific film 210 having a patternable material may be etched to expose the upper bonding electrodes 206u. Suitable materials for puncturing may be in the form of a tape and may include at least one of a die attachment film, a nonconductive film, and an anisotropic conductive film. It may be beneficial for the mount-specific adhesive film 210 to include a suitable material for puncturing. The mount-specific adhesive film 210 may have patterning properties and puncturing properties, wherein the first adhesive film 130c may have better patterning properties, and the mount-specific adhesive film 210 may have better puncturing properties. Alternatively, the mount-specific adhesive film 210 may have comparable patterning and puncturing properties with respect to the first adhesive film 130c. As illustrated in FIG. 5A, because the mount-specific adhesive film 210 is provided, a second adhesive film on semiconductor device 120c may not be present, although the second adhesive film may be optionally provided. Additionally, via-electrode 122c may have an enlarged head 122p to facilitate mounting on the PCB 200.

Figure 5B:
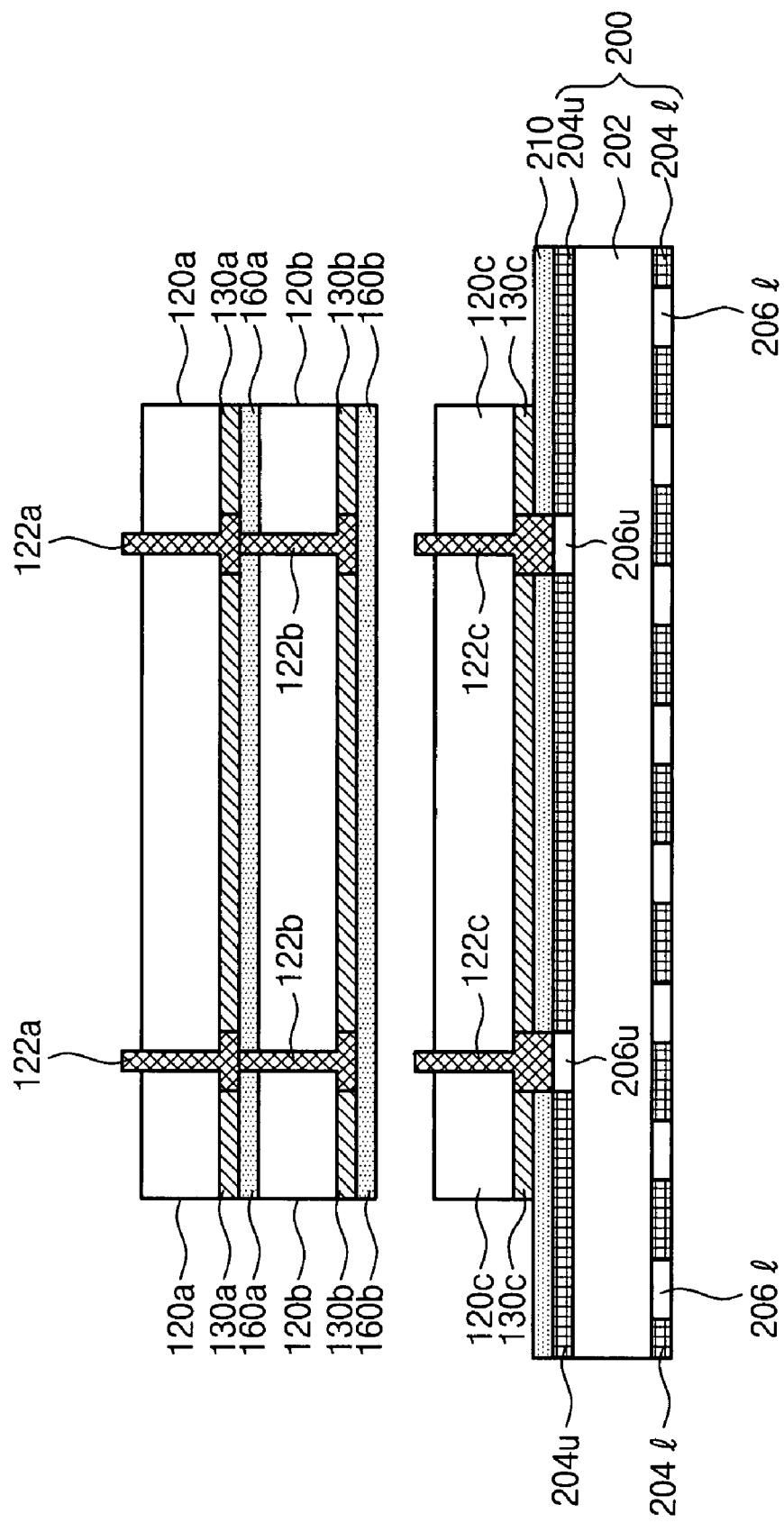

Referring to FIGS. 5B and 5C, the stacked semiconductor devices 120a, 120b, and 120c may be mounted on the PCB 200, so as to electrically connect the upper bonding electrodes 206u of the PCB 200 with the via-electrodes 122c of the end semiconductor device 120c of the stack. As illustrated in FIG. 5B, mounting the stacked semiconductor devices 120a, 120b, and 120c on the PCB 200 may be performed by mounting the semiconductor device 120c (serving as an end semiconductor device for the stack) on the PCB 200 and mounting the stacked semiconductor devices 120a and 120b on the semiconductor device 120c. A thermal compression process may be used to mount the stacked semiconductor devices 120a, 120b, and 120c on the PCB 200.

Where the mount-specific adhesive film 210 is made of a patternable material, the semiconductor devices 120a~120c may be mounted on the PCB 200 by matching the enlarged heads 122p (FIG. 5A) of the via-electrodes 122c with the exposed upper bonding electrodes 206u to form an electrical connection. Where the mount-specific adhesive film 210 is made of a suitable material for puncturing, the semiconductor devices 120a~120c may be mounted by puncturing the mount-specific adhesive film 210 with the enlarged heads 122p (FIG. 5A) of the via-electrodes 122c so as to be electrically connect the enlarged heads 122p with the upper bonding electrodes 206u.

Figure 5D:
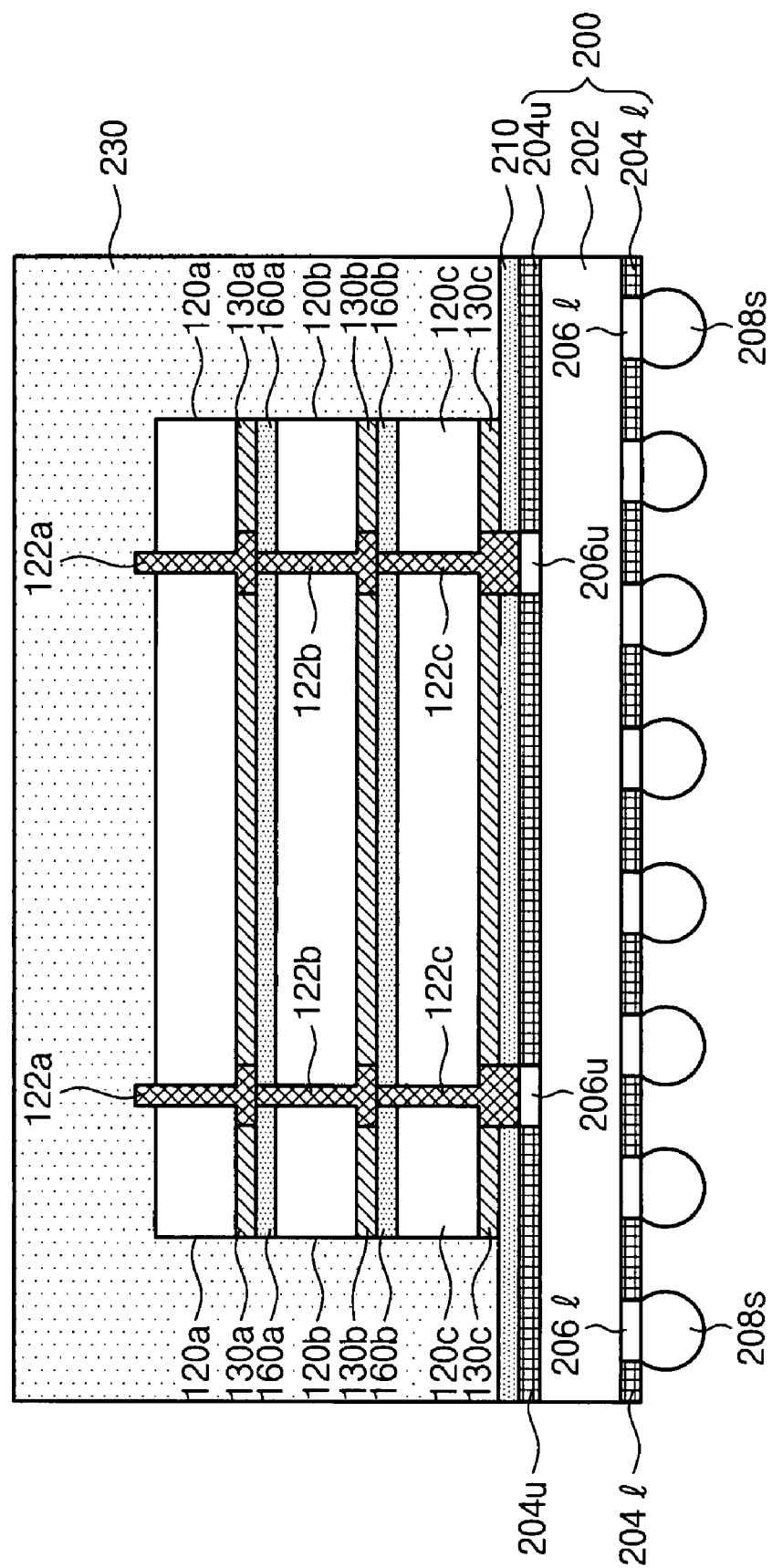

Referring to FIG. 5D, a molding material 230 may be formed to cover the upper surface of the PCB 200. The molding material 230 may include an epoxy molding compound (EMC). Solder balls 208s may be formed on lower bonding electrodes 206l of the PCB 200. The solder balls 208s may include a solder material.

By constructing a semiconductor device package having a multi-layer adhesive film structure including patternable and puncturable adhesive materials between stacked semiconductor devices, a more reliable stacked semiconductor device structure having improved physical and electrical characteristics may be achieved. An adhesive structure may include a first adhesive film having first patterning properties and first puncturing properties; and a second adhesive film on the first adhesive film, the second adhesive film having second patterning properties and second puncturing properties, wherein the first patterning properties are better than the second patterning properties, and the second puncturing properties are better than the first puncturing properties. Example embodiments herein should be considered merely illustrative and not restrictive. Those ordinarily skilled in the art will appreciate that other variations/modifications/alterations are possible without departing from the scope and spirit of the teachings as a whole.

What is claimed is:

1. A method of stacking semiconductor devices, comprising:
   preparing a plurality of semiconductor devices, each having an upper surface and a lower surface and one or more via-electrodes protruding from at least one of the upper surface and lower surface;
   forming a first adhesive film on the upper surface of the plurality of semiconductor devices, the first adhesive film having first patterning properties and first puncturing properties;
   forming a second adhesive film on the first adhesive film of at least one of the plurality of semiconductor devices, the second adhesive film having second patterning properties and second puncturing properties, wherein the first patterning properties are better than the second patterning properties, and the second puncturing properties are better than the first puncturing properties; and
   stacking the plurality of semiconductor devices to electrically connect the one or more via-electrodes by puncturing the second adhesive film with a protruding portion of the one or more via-electrodes.

2. The method of claim 1, wherein forming the first adhesive film comprises:
   etching the first adhesive film to expose the one or more protruding via-electrodes.

3. The method of claim 2, wherein the first adhesive film is formed to cover a top surface of the one or more via-electrodes protruding from the upper surface of the semiconductor device prior to etching the first adhesive film.

4. The method of claim 1, wherein stacking the semiconductor devices comprises:
   puncturing the second adhesive film with the protruding portion of the one or more via-electrodes protruding from a lower surface of an adjacent semiconductor device.

5. The method of claim 1, wherein stacking the plurality of semiconductor devices is performed by thermal compression.

6. A method of fabricating a semiconductor device package, comprising:
   stacking the plurality of semiconductor devices according to claim 1;
   providing a printed circuit board having an upper surface with bonding electrodes;
   forming a mount-specific adhesive film on the upper surface of the printed circuit board; and
   mounting the stacked plurality of semiconductor devices on the upper surface of the printed circuit board, whereby the one or more via electrodes of at least one semiconductor device electrically connect with the bonding electrodes of the printed circuit board.

7. The method of claim 6, wherein forming the mount-specific adhesive film further comprises:
   etching the mount-specific adhesive film to expose one or more bonding electrodes on the upper surface of the printed circuit board.

8. The method of claim 7, wherein mounting the stacked plurality of semiconductor devices comprises contacting one or more via electrodes of a semiconductor device with bonding electrodes of the printed circuit board.

9. The method of claim 6, wherein mounting the stacked plurality of semiconductor devices comprises puncturing the mount-specific adhesive film with the one or more via-electrodes protruding from a semiconductor device to electrically connect the one or more via-electrodes with the bonding electrodes of the printed circuit board.

10. The method of claim 6, wherein mounting the stacked plurality of semiconductor devices is performed by thermal compression.

11. The method of claim 6, further comprising forming a molding material to cover the stacked plurality of semiconductor devices mounted on the upper surface of the printed circuit board.

12. The method of claim 1, wherein the first adhesive film is formed to be substantially planar with a top surface of the one or more via-electrodes protruding from the upper surface of the semiconductor device so as to expose the top surface of the one or more via-electrodes.

13. The method of claim 1, wherein the second adhesive film is formed to cover an exposed top surface of the one or more via-electrodes protruding from the upper surface of the semiconductor device.

* * * * *